US011238674B2

(12) United States Patent
Amelunxen et al.

(10) Patent No.: US 11,238,674 B2
(45) Date of Patent: Feb. 1, 2022

(54) SIMULATION OF DIFFERENT TRAFFIC SITUATIONS FOR A TEST VEHICLE

(71) Applicant: dSPACE digital signal processing and control engineering GmbH, Paderborn (DE)

(72) Inventors: Hendrik Amelunxen, Paderborn (DE); Rainer Franke, Paderborn (DE); Christian Wächter, Paderborn (DE)

(73) Assignee: DSPACE DIGITAL SIGNAL PROCESSING AND CONTROL ENGINEERING GMBH, Paderborn (DE)

( * ) Notice: Subject to any disclaimer, the term of this patent is extended or adjusted under 35 U.S.C. 154(b) by 400 days.

(21) Appl. No.: 16/359,294

(22) Filed: Mar. 20, 2019

(65) Prior Publication Data
US 2019/0295335 A1 Sep. 26, 2019

(30) Foreign Application Priority Data

Mar. 21, 2018 (EP) .................................... 18163089

(51) Int. Cl.
*G07C 5/02* (2006.01)
*G05D 1/00* (2006.01)
(Continued)

(52) U.S. Cl.
CPC ............ *G07C 5/02* (2013.01); *G05D 1/0088* (2013.01); *G06F 30/20* (2020.01); *G09B 9/04* (2013.01);
(Continued)

(58) Field of Classification Search
CPC ......... G06F 30/20; G01C 21/34; G06T 17/05; B60W 40/08
See application file for complete search history.

(56) References Cited

U.S. PATENT DOCUMENTS 7,865,794 B2 * 1/2011 Rajski ............ G01R 31/318385
714/739
9,956,963 B2 * 5/2018 Vijaya Kumar .. B60W 50/0098
(Continued)

FOREIGN PATENT DOCUMENTS

DE  102005047591 A1  4/2007
DE  102006044086 A1  4/2008
(Continued)

OTHER PUBLICATIONS

EPO, Office Action for European Application No. 18163089.8, dated Aug. 16, 2019.
(Continued)

*Primary Examiner* — Thai Q Phan
(74) *Attorney, Agent, or Firm* — Orrick, Herrington & Sutcliffe LLP; Joseph A. Calvaruso; K. Patrick Herman

(57) ABSTRACT

A method for simulating different traffic situations for an autonomous or semiautonomous test vehicle. The method includes the simulated driving of the test vehicle through a simulated road network, and the simulated randomized driving of other vehicles through the simulated road network. The method also includes the capture of vehicle driving parameters. Further according to the method, there is a determination of whether a predefined traffic situation is satisfied by the test vehicle and at least one of the other vehicles, the at least one other vehicle being within a test zone around the test vehicle. Where the predefined traffic situation is satisfied, randomized driving of the at least one other vehicle can be stopped, and the at least one other vehicle can be made to perform a predetermined driving maneuver. The predetermined driving maneuver can provoke a reaction by the test vehicle.

12 Claims, 4 Drawing Sheets

(51) Int. Cl.
*G09B 9/04* (2006.01)
*G09B 19/14* (2006.01)
*G06F 30/20* (2020.01)
*B60W 40/08* (2012.01)

(52) U.S. Cl.
CPC ............ *G09B 19/14* (2013.01); *B60W 40/08* (2013.01); *G05D 2201/0213* (2013.01)

(56) References Cited

U.S. PATENT DOCUMENTS

| | | | | |
|---|---|---|---|---|
| 10,037,689 | B2* | 7/2018 | Taylor | G06K 7/10475 |
| 10,489,972 | B2* | 11/2019 | Atsmon | G05D 1/0088 |
| 10,496,766 | B2* | 12/2019 | Levinson | G05D 1/0214 |
| 2009/0040054 | A1* | 2/2009 | Wang | B60W 30/095 340/576 |
| 2017/0072850 | A1* | 3/2017 | Curtis | G08G 1/166 |
| 2017/0355377 | A1* | 12/2017 | Vijaya Kumar | B60W 40/08 |
| 2018/0174449 | A1* | 6/2018 | Nguyen | G08G 1/0104 |
| 2019/0228571 | A1* | 7/2019 | Atsmon | G06T 19/006 |
| 2019/0295333 | A1* | 9/2019 | Nista | B60R 16/0234 |
| 2020/0010077 | A1* | 1/2020 | Cormack | B60W 40/08 |
| 2020/0151611 | A1* | 5/2020 | McGavran | H04W 4/44 |

FOREIGN PATENT DOCUMENTS

| | | |
|---|---|---|
| DE | 102016109651 A1 | 12/2016 |
| WO | WO 2016/172009 A1 | 10/2016 |

OTHER PUBLICATIONS

EPO, Extended Search Report for European Application No. 18163089.8, dated Aug. 20, 2018.

Olstam, "A model for simulation and generation of surrounding vehicles in driving simulators," Linköping Studies in Science and Technology Licentiate Thesis No. 1203, Linköpings Universitet Institute of Technology, Dept. of Science and Technology, Linköpings Universitet, SE-601 74 Norrköping, Sweden, Norrköping 2005.

Zofka, et al., "Data-Driven Simulation and Parametrization of Traffic Scenarios for the Development of Advanced Driver Assistance Systems," 18th International Conference on Information Fusion Washington, DC—Jul. 6-9, 2015, Department of Technical Cognitive Assistance Systems, FZI Research Center for Information Technology Karlsruhe, Germany, pp. 1422-1428.

Zofka, et al., "Testing and Validating High Level Components for Automated Driving: Simulation Framework for Traffic Scenarios," 2016 IEEE Intelligent Vehicles Symposium (IV) Gothenburg, Sweden, Jun. 19-22, 2016, pp. 144-150.

* cited by examiner

Maneuver 1
Rear-end collision avoidance

Ego
requirements

```
v > 40;
```

Fellow 1
requirements    [delete]        vehicle maneuver

```
lane_rel = -1;
s_rel = -10.. 10;
```

Fellow 2
requirements    [delete]        vehicle maneuver

```
lane_rel = 0;
s_rel = 0.. 50;
```

```
oneof(
a = -20 until v = 0; a = -25 until v = 0;
a = -30 until v = 0;
);
```

Fellow 3
requirements    [delete]        vehicle maneuver

```
lane_rel = 1;
s_rel = -10.. 10;
```

[add fellow]

[save]   [back]

Fig. 4

SIMULATION OF DIFFERENT TRAFFIC SITUATIONS FOR A TEST VEHICLE

CROSS-REFERENCE TO RELATED APPLICATIONS

This application claims priority to European Patent Application No. EP18163089.8, filed on Mar. 21, 2018, the contents of which are incorporated herein by reference in their entirety and for all purposes.

FIELD OF THE INVENTION

The present disclosure generally relates to simulating different traffic situations for an autonomous or semiautonomous test vehicle.

BACKGROUND OF THE INVENTION

In general, a test vehicle has a sensor system, having at least one sensor, for detecting objects in the surroundings of the vehicle and is controlled at least partially on the basis of signals captured by the sensor system. Applicable sensors of the test vehicle are generally ultrasonic sensors, LIDAR sensors, RADAR sensors and/or cameras, which are used to capture the surroundings of the test vehicle so as thus to attain autonomous or at least semiautonomous driving of the test vehicle. Applicable sensor systems are additionally systems for receiving data from other vehicles or static apparatuses in the road traffic in order to attain autonomous or at least semiautonomous driving of the vehicle by means of evaluation of the data (Car2X communication).

During autonomous driving, the driver no longer needs to engage in the driving process at all, at least over long stretches. The semiautonomous method at least involves the vehicle reacting to particular traffic situations automatically, that is to say without the intervention of the driver, and thus, for example, avoiding a collision with a slower vehicle ahead by virtue of a braking operation automatically being initiated when this vehicle ahead is approached. In order to be able to perform automated driving maneuvers of this kind, the sensors of the sensor system are used to detect where other vehicles, pedestrians or other obstacles are situated in the surroundings of the vehicle.

Before a vehicle equipped with a corresponding sensor system can be operated for semiautonomous or autonomous driving in practice, that is to say on the actual road network, a large number of tests need to be performed in order to ensure that the semiautonomous or autonomous driving is actually reliable and safe. Although such tests are carried out—typically at an advanced stage—on public roads using real vehicles, tests in the form of simulations are typically performed beforehand. In order to check the reaction of the sensor system for a large number of different, including unforeseen, situations, it is standard practice in the art to perform such tests in randomized fashion, that is to say as realistically as possible, without prearranging particular traffic situations. Randomized tests of this kind thus become very time consuming, however, because the driving maneuvers performed are by definition not predefined, and it is therefore necessary to wait for useful situations which provoke a reaction from the test vehicle.

DE 10 2005 047 591 A1 discloses a method for unburdening a driver during operation of a motor vehicle via a multiplicity of driver assistance systems for performing a multiplicity of different driving maneuvers, and means for obtaining situation data for describing the current driving situation. The method comprises the steps of: obtaining situation data by means of the motor vehicle, using the situation data to determine a limited set of driving maneuvers appropriate to the situation by means of the motor vehicle, and reaching an agreement between the motor vehicle and the driver about the execution of a single driving maneuver appropriate to the situation.

Furthermore, DE 10 2006 044 086 A1 discloses a system and method for the virtual simulation of traffic situations, having: a display unit for graphically displaying the virtual traffic situations and an input unit; and at least one modeled reference vehicle and at least one further modeled road user, wherein the reference vehicle has a modeled detection device for capturing the virtual surroundings of the reference vehicle, and during a simulated traffic situation the reference vehicle behaves, at least intermittently, by taking into consideration the information captured by the detection device. In particular, this is meant to provide a system for analyzing hazard situations critical to accidents.

DE 10 2017 116 192 A1 discloses a method and system for using virtual data for testing and training parking space detection systems. Aspects of the invention integrate virtual driving surroundings with sensor models (e.g., from a radar system) in order to provide virtual radar data in relatively large volumes in a relatively short period of time. The sensor models capture values for relevant parameters of a training data record. Relevant parameters can be randomized in the recorded data in order to ensure a diverse training data record having minimal bias. Since the driving surroundings are virtualized, the training data record can be generated together with ground truth data. The ground truth data are used to annotate the actual positions used for training a parking space classification algorithm to detect the boundaries of the free space.

DE 10 2016 109 651 A1 discloses the practice of having a virtual autonomous vehicle driven in virtual surroundings with further road users driving in randomized fashion in order to provoke and log driving situations.

Finally, the document "A model for simulation and generation of surrounding vehicles in driving simulators" by Johan Janson Olstam, Linkoping University, Norrköping 2005, discloses a driving simulator with virtual surroundings having virtual road users driving in randomized fashion, and the generation of predefined traffic situations in the virtual surroundings.

As such, there is apparent interest in technologies which are applicable to simulating different traffic situations for a test vehicle, and to the randomized testing of a test vehicle.

BRIEF DESCRIPTION OF THE DRAWINGS

FIG. 4 illustrates an example GUI which can be used to input a predefined traffic situation on a screen, according to an embodiment of the present disclosure.

DETAILED DESCRIPTION

Figure 1:
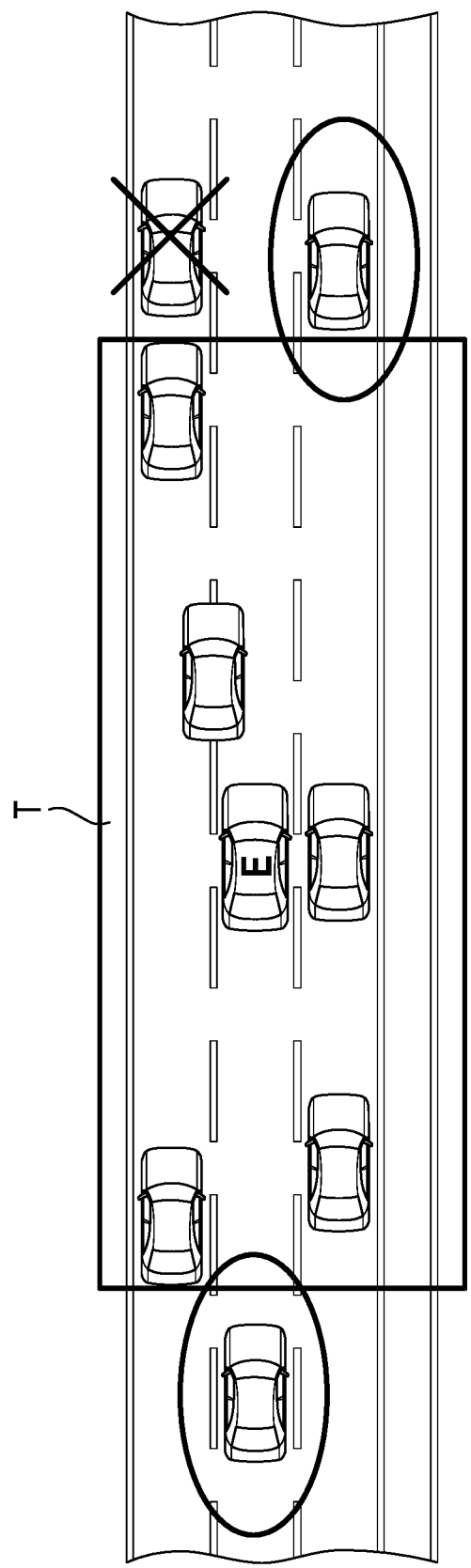
FIG. 1 illustrates a schematic view of an example first traffic situation, according to an embodiment of the present disclosure.

According to an aspect of the invention there is, during the simulation of different traffic situations for a test vehicle, an increase in the frequency of usable situations in which an autonomous or semiautonomous reaction from the test vehicle is successfully provoked, without substantially detracting from the realism of the simulation.

As discussed herein, there is, for instance, provision for a method for simulating different traffic situations for a test vehicle, having the following method steps:

- simulated driving of the test vehicle through a simulated predetermined road network,
- simulated randomized driving of a plurality of other vehicles through the road network,
- capturing of at least one driving parameter for the test vehicle,
- capturing of at least one respective driving parameter for other, such as for all other, vehicles within a predetermined test zone around the test vehicle,
- checking, during the randomized driving of the other vehicles, of whether the test vehicle and at least one other vehicle in the test zone are in a predefined traffic situation, wherein a predefined traffic situation is provided by at least one driving parameter of another vehicle within the test zone, in particular optionally also by further driving parameters of other vehicles or of the test vehicle, and
- if the test vehicle and at least one other vehicle in the test zone are in a predefined traffic situation, terminating of the randomized driving of at least one other vehicle in the predefined traffic situation, and forcing of a predetermined driving maneuver for the other vehicle, which is no longer driving in randomized fashion, the predetermined driving maneuver being prescribed by the detected predefined traffic situation.

According to various embodiments of the invention, a check is thus performed to determine whether there is a predefined traffic situation. A predefined traffic situation of this kind comprises at least one driving parameter of the test vehicle and at least one driving parameter of another vehicle within the test zone and exists whenever these driving parameters are fulfilled, independently of the captured driving parameters of other vehicles.

A fundamental aspect of various embodiments of the invention is that the driving of the other vehicles is simulated in randomized fashion, which is understood to mean that the other vehicles in the simulation move through the road network stochastically, but according to predetermined rules, according to which the test vehicle is treated no differently than all the other vehicles. The predetermined rules can be the same or else different for all the other vehicles. In particular, the rules can prescribe a configuration for any other vehicle, for example performance, type of vehicle, etc. Furthermore, there can be provision for the respective other vehicle to travel along a predetermined route or to choose this route at random. In addition, there can be a preset for how fast another vehicle travels, in what lanes of a road it typically travels, and whether or to what degree it observes traffic regulations. In particular, it is true of all the vehicles that they move through the traffic realistically (i.e., plausibly), that is to say taking into consideration other vehicles as they travel, and normally not leaving the road network.

Nevertheless, this randomized driving of the vehicles can experience critical situations in which a threatening situation arises or can arise. A threatening situation can be, as examples, a collision between at least two vehicles, or a situation preceding such a collision. A threatening situation can alternatively be a situation in which only a single vehicle—such as the test vehicle alone—is threatened, for example the single vehicle skidding, leaving the road, or being at risk of leaving the road. Otherwise, the driving of the test vehicle through the predetermined road network can take place along a predetermined route or be at least partially random, so that, for example, at every next junction a purely random decision is made as to whether—and if so to where, —the test vehicle turns off.

As already explained earlier on, it is also true of the test vehicle, within the context of various embodiments of the present invention, that said test vehicle preferably has a sensor system, having at least one sensor, for detecting objects in the surroundings of the vehicle, and is controlled at least partially on the basis of signals captured by the sensor system. In this way, it is possible to simulate how the test vehicle behaves autonomously or semiautonomously in critical situations. The detection of objects in the surroundings of the test vehicle by the sensor system is naturally dependent on the range and direction of the respective sensors. Typical sensors comprise ultrasonic sensors, cameras, RADAR and LIDAR sensors, the latter three normally having a greater range than ultrasonic sensors.

The driving of the test vehicle in the simulated road network is naturally virtual. Nevertheless, different simulation modes are possible, in which hardware is involved to different degrees. In the case of complete simulation, the term "software in the loop" or "model in the loop" is used. This involves everything being simulated, that is to say not just the road network and the other vehicles, but also the test vehicle with its sensor system, the travel of the test vehicle through the road network, and the detection of its surroundings by at least one sensor of the sensor system. The term "hardware in the loop" is used when, for example, the actual controller and/or an actual sensor of the sensor system is used as hardware during testing. Finally, the term "vehicle in the loop" is used when a test vehicle is actually driven. In general, actual driving of the test vehicle then takes place on cordoned-off ground, such as on a decommissioned airfield, the sensors of the test vehicle being supplied with simulated signals representing the simulated road network and the simulated surroundings with the other vehicles.

It is thus possible for the test vehicle to be driven through the predetermined road network by a real driver (vehicle in the loop) or by a simulated driver (software/model/hardware in the loop). In the case of a simulated driver, the test vehicle is driven through the road network completely in simulation. As explained previously, however, it is also possible to have a real test vehicle driven on a cordoned-off area, namely by means of a real driver, with the sensors of the sensor system of the test vehicle then being supplied with simulated signals in order to simulate other vehicles in the surroundings of the test vehicle. Overall, this is actual semiautonomous driving of the test vehicle. The test vehicle is naturally also able, actually or in simulation, to drive through the road network fully autonomously. Furthermore, it is also possible to have a virtual vehicle driven by a real driver in a hardware/model/software in the loop simulation, for example in a driving simulator with a reconstructed driver's cab comprising for example a steering wheel, pedals, a gearshift and further control elements of a real vehicle.

The test zone around the test vehicle can be of different dimensions. In particular, the test zone around the test vehicle can preferably be at least large enough for a plurality of other vehicles to be able to drive in this zone and hence in proximity to the test vehicle. According to a preferred development of the invention, there is provision for the dimensions of the test zone around the test vehicle to correspond at least to the maximum range of the sensor system. The test zone therefore covers the entire area that can be captured on the basis of the sensors of the sensor system. Thus, the simulation is particularly realistic, since all the other vehicles that can actually also be detected by means of the sensor system in practice can be taken into consideration.

Otherwise, according to a preferred development of the invention, there is provision for the test zone to come directly up to the test vehicle, and/or to surround the test vehicle completely. As such, in extreme cases other vehicles can be completely in the test zone (e.g., in a critical situation such as shortly before a collision, or in the event of a collision wherein the other vehicles can be in direct contract with the test vehicle).

As to the driving parameters which are experienced by the test vehicle and the other vehicles, various parameters—which, in turn, define a traffic situation—can be considered. According to a preferred development of the invention, the driving parameters which used are the position of the test vehicle or of at least one other vehicle, and/or the speed of the test vehicle or of at least one other vehicle, and/or the direction of the test vehicle or of at least one other vehicle, and/or the acceleration of the test vehicle or of at least one other vehicle. Additional parameters are naturally also conceivable, such as the type of the test vehicle or of another test vehicle (i.e., whether it is, as examples, a compact car, a sedan, an SUV, a pickup truck, or a truck), and whether, for example, the vehicle pulls a trailer having a particular length. Moreover, it is preferable to take into consideration not just a sole other vehicle, but rather a plurality of other vehicles which are in the test zone.

As far as a predefined traffic situation in terms of these driving parameters is concerned, it is fundamentally possible for precisely stipulated individual values to be defined for the driving parameters. Preferably, however, a predefined traffic situation is specified by giving a range of values for each utilized parameter. In this way, a greater number of distinct traffic situations can arise in the course of randomized testing. Moreover, such testing can involve a departure from purely randomized testing insofar as at least one other vehicle can perform a driving maneuver which is appropriately responsive to a particular traffic situation. Such at least one other vehicle is preferably included in the definition of the traffic situation (i.e., it is part of the definition of the traffic situation by virtue of it providing at least one driving parameter).

As far as the positions of the other vehicles are concerned, these are preferably given by their relative positions in relation to the test vehicle. A relative position of this kind is preferably a relative longitudinal position in relation to the test vehicle, a relative transverse position in relation to the test vehicle, and/or the lane in which another vehicle travels relative to the test vehicle. It is furthermore advantageous if the speed and/or the acceleration of the other vehicles are, at least optionally, indicated in relation to the test vehicle. In this configuration a predefined traffic situation can, for example, be defined completely or partially in terms of a further vehicle having a particular speed relative to that of the test vehicle, regardless of the absolute speed of the test vehicle or of the other vehicle.

Furthermore, according to a preferred configuration of the invention, the simulation operates such that the randomized driving of the plurality of other vehicles through the road network occurs only within a predetermined distance from the test vehicle. In particular, the predetermined distance from the test vehicle preferably corresponds to the test zone around the test vehicle. Preferably, there is thus provision for the simulation to involve the other vehicles being "generated" outside the test zone and then driving into the test zone. Then, if one of these other vehicle leaves the test zone via the front, rear, or side of the test vehicle, such other vehicle is removed from the simulation.

Fundamentally, it is conceivable for there to be provision for just a single predefined traffic situation in which there is a departure from purely randomized testing. According to a preferred configuration of the invention, however, a plurality of predefined traffic situations are prescribed that, if reached, result in a predetermined driving maneuver by at least one other vehicle being provoked.

Fundamentally, it is also possible for the detected predefined traffic situation to prescribe performance of one of a plurality of predetermined driving maneuvers by at least one other vehicle. As such, for example, a predetermined driving maneuver of this kind can be selected from a prescribed group at random.

It is likewise possible for there to be provision for a plurality of predefined traffic situations for provoking a single predetermined driving maneuver. In these embodiments, a given traffic situation from the plurality of predefined traffic situations can be selected. As such, if the test vehicle and at least one other vehicle are in the selected traffic situation, the predetermined driving maneuver can be provoked for the vehicle that is no longer driving in randomized fashion. Subsequently, then can be repeated selection (e.g., in a cyclic or random fashion) of a new traffic situation from the plurality of predefined traffic situations. Such embodiments can sometimes bring about better coverage of different test situations, for example by virtue of the test vehicle being permitted to get up to within different distances from a vehicle ahead before the vehicle ahead performs a driving maneuver forced by the approach.

According to a preferred development of the invention, there is provision for the driving parameters of the test vehicle and of at least one other vehicle to be recorded from at least the point in time at which it has been detected that a predefined traffic situation exists. Preferably, the at least one other vehicle can be one which is involved in the critical traffic situation. In this way, applicable situations are also analyzable afterwards, and can be repeated in a defined fashion. Preferably, the following driving parameters of the test vehicle and of the other vehicles involved in the critical traffic situation are recorded: the position of the test vehicle or of at least one other vehicle, the speed of the test vehicle or of at least one other vehicle, the direction of the test vehicle or of at least one other vehicle, and/or the acceleration of the test vehicle or of at least one other vehicle.

Furthermore, the invention relates to a nonvolatile, computer-readable storage medium having commands stored thereon that, when executed on a processor, bring about a method as described above.

Finally, the invention also relates to a computer system configured for performing a method as described above.

Figure 2:
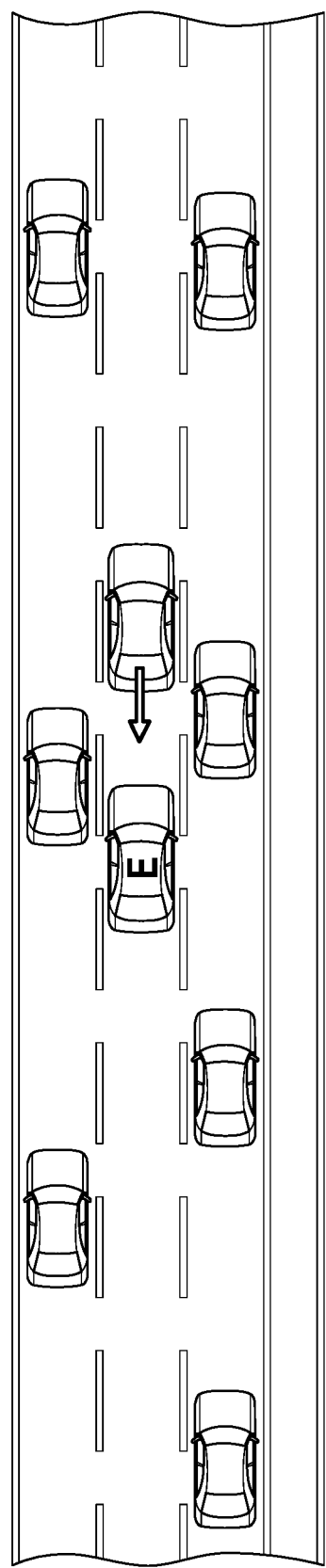
FIG. 2 illustrates a schematic view of an example second traffic situation, according to an embodiment of the present disclosure.
Figure 3:
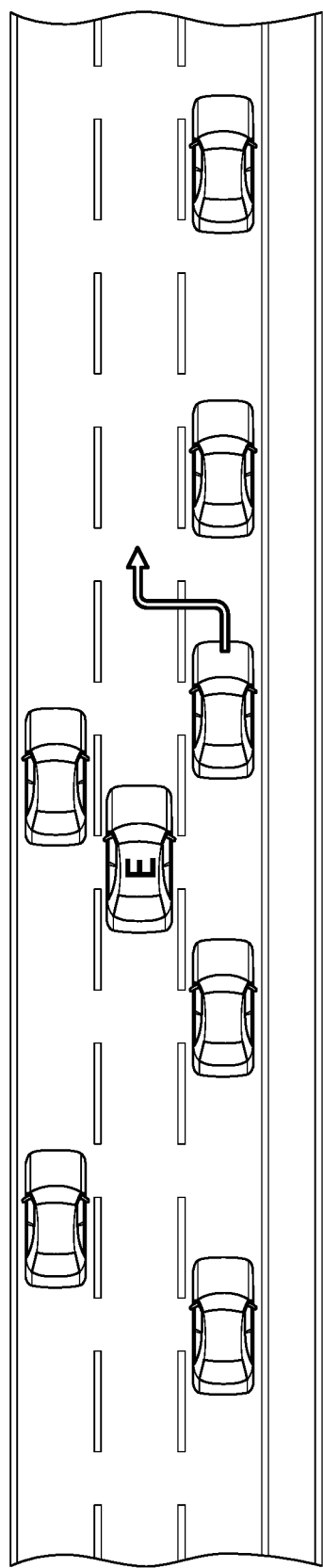
FIG. 3 illustrates a schematic view of an example third traffic situation, according to an embodiment of the present disclosure.

The invention is explained in more detail below within the context of a preferred exemplary embodiment on the basis of the drawings, in which FIG. 1 schematically shows a first traffic situation according to a preferred exemplary embodiment of the invention;

FIG. 2 schematically shows a second traffic situation according to a preferred exemplary embodiment of the invention;

FIG. 3 schematically shows a third traffic situation according to a preferred exemplary embodiment of the invention; and FIG. 4 shows a GUI according to a preferred exemplary embodiment of the invention, which GUI can be used to input a predefined traffic situation on a screen.

A fundamental aspect of various embodiments of the present invention is to increase the efficiency of randomized tests by increasing the temporal density of usable events of interest in the simulation. The test on controllers for highly automated (semiautonomous) or autonomous driving—in comparison with the tests on driving dynamics control systems, etc.—does not just require a much higher number of simulated test kilometers. Instead, a wide variety of traffic situations must also be simulated. In conventional methods, these traffic situations need to be exactly predefined in advance. However, because of the high expenditure of effort called for to test functionalities during semiautonomous or completely autonomous driving, there is the need for, on the one hand, test scenarios having a multiplicity of objects involved to be able to be created easily. On the other hand, in order to increase the depth of testing, the aim is also to generate test scenarios which have not been precisely defined in advance. Finally, an algorithm implemented in a vehicle driving semiautonomously or autonomously must work correctly and reliably in any driving situation.

Randomized tests are particularly suitable for this purpose. Instead of exactly predefining short driving maneuvers, the virtual vehicle moves on a large virtual road network over a long period of time and in so doing interacts with numerous other road users, essentially with other vehicles, also called "fellows." Such tests are, in particular if performed in real time, naturally very time consuming since it is necessary to wait for the occurrence of situations of interest that provoke a reaction from the test vehicle. However, according to the preferred exemplary embodiment of the invention described herein, the frequency of such situations can be increased.

The method for simulating different traffic situations for a test vehicle, according to the presently described preferred exemplary embodiment of the invention, can include for the following method steps.

A virtual test vehicle drives through a simulated predetermined road network as part of a simulation, in particular a complete simulation (i.e., software in the loop). A predetermined route can be prescribed for the test vehicle. In the alternative, the test vehicle can drive through the road network at random by making a fresh decision, purely at random, at every turn-off opportunity as to whether the test vehicle takes a turn-off, and if so which turn-off. Around the test vehicle, simulated randomized driving of a plurality of other vehicles through the road network takes place. These other vehicles behave independently and realistically, and no differently toward the test vehicle than toward other vehicles. This produces perpetually new traffic situations that are not defined in advance, thusly matching reality. However, implementation is such that, generally speaking, there is no generation of critical traffic situations of the sort which would test the automatic reaction of the autonomously-driven test vehicle.

Moreover, the method according to the preferred exemplary embodiment of the invention described in the present case further provides for the capture of a plurality of driving parameters of the test vehicle, such as the position thereof, the speed thereof, the orientation thereof, and the acceleration thereof. Likewise, applicable driving parameters can be captured for all other vehicles within a predetermined test zone around the test vehicle, that is to say position, speed, orientation and acceleration. The dimensions of the test zone can have dimensions that go beyond the range of all the sensors of the sensor system of the test vehicle. As such, all other vehicles that can be detected by the sensors of the sensor system of the test vehicle are thusly also encompassed within the test zone.

During the randomized driving of the other vehicles, a check can be continuously performed to ascertain whether the test vehicle and other vehicles in the test zone are in a predefined traffic situation. To this end, a plurality of traffic situations can be predefined. Each of these traffic situations can be suitable for instigating a critical traffic situation for which an automatic reaction from the test vehicle can be expected. Predefined traffic situations of this kind are provided via the aforementioned driving parameters of the test vehicle and a predetermined number of other vehicles within the test zone. For these driving parameters, ranges of values can be predefined. In this way, tolerances can be established with regard to the traffic situations which are suitable for actively provoking a critical traffic situation (i.e., by abandoning the randomized driving of at least one other vehicle).

In the event that the test vehicle and the prescribed number of other vehicles in the test zone find themselves in a predefined traffic situation, the randomized driving of the other vehicles involved in the critical traffic situation can be abandoned, and a predetermined driving maneuver can be provoked in at least one of the other vehicles. In this way, a traffic situation that is critical for the test vehicle can be instigated. This critical traffic situation can produce an autonomous or semiautonomous reaction from the test vehicle on the basis of the signals captured by the sensors of the sensor system of the test vehicle. Additionally, with detection that the test vehicle and the predetermined number of other vehicles in the test zone are in a predefined traffic situation, the driving parameters of the vehicles involved, including the test vehicle, can be recorded. As such, the resulting situation can be analyzed later, and if need be to be reproduced.

By changing various parameters, in particular by changing simulation parameters, the traffic situations can easily be varied. The changed parameters can include the number of vehicles and the starting positions thereof, and the parameters of the vehicles (e.g., the vehicle types—according to the performance and design—such as automobile, truck, with trailer, etc.). It is also possible to vary parameters such as the setpoint speed, safety distances, volume of traffic, average speeds, etc.

The predefined traffic situations suitable for provoking critical traffic situations, can, with the help of applicable ranges of values for the captured driving parameters, be predefined as abstract and tolerance-based situations. It is thus possible for situation patterns to be defined, such as "right-hand lane blocked, a vehicle approaching quickly from behind in the left-hand lane, a vehicle ahead in the same lane." When a predefined traffic situation of this kind is detected, a previously defined movement behavior is imparted to the vehicles involved, such as "vehicle ahead slowing at −8 m/s$^2$ to 15 km/h" or "overtaking vehicle maintaining speed and cutting in 5 m in front of the test vehicle."

Through the recognition of such tolerance-based scenarios, the selection of the vehicles involved, and the imparting of the previously defined movement behavior of at least one other vehicle, realistic movements of vehicles can occur. These, realistic movements can be without irregularities or discontinuities, thereby allowing the sensor system of the test vehicle—including the algorithms to be tested for the autonomous or semiautonomous driving—to be able to handle these movements. In this way, it is possible to ensure that, in general, the critical traffic situations arise exclusively on the test vehicle rather than among the other vehicles themselves. The method according to the preferred exemplary embodiment of the invention described in the present case can thus be used to test, record, and evaluate specific scenarios to be tested, namely dangerous situations and possible incorrect behavior, in any plausible situation. It is thus possible to decrease, by orders of magnitude, the average interval of time between two critical traffic situations that can be expected to produce an automatic reaction from the test vehicle.

FIG. 1 shows heavy traffic with a plurality of other vehicles around a test vehicle E, also called the ego vehicle. For the sake of clarity, the other vehicles bear no reference signs of their own. The test vehicle E is situated centrally within a virtual test zone T around the test vehicle. During the simulation, vehicles are initialized outside the test zone T (see depicted vehicles with ellipses). After exit from the test zone T, the vehicles are deinitialized (see depicted vehicles with crosses thereupon). Within the test zone T, the other vehicles behave plausibly according to their corresponding parameters. A predefined traffic situation which leads to the abandonment of the completely randomized driving of the other vehicles can, for example, be defined according to the following four criteria, which are to be satisfied at the same time:

Criterion 1: a vehicle, which is in front of the test vehicle E and in the same lane as the test vehicle E, is at a distance of less than 50 m from the test vehicle E.

Criterion 2: a vehicle, which is in a lane to the right of the test vehicle E, is at a distance of less than 10 m from the test vehicle E.

Criterion 3: a vehicle, which is in the lane to the left of the test vehicle E, is at a distance of less than 10 m from the test vehicle E.

Criterion 4: the test vehicle is moving at a speed of at least 40 km/h.

As such, if a situation has been detected in which a vehicle is in front of the test vehicle E, and in which the left-hand and right-hand lanes are occupied by further vehicles, the vehicle ahead of the test vehicle can have heavy braking imparted to it. The braking delay can be to be configured beforehand, and can be varied in different runs of the simulation. Such is depicted schematically in FIG. 2. According to the detected situation of the simulation, the test vehicle E thusly approaches the other vehicle ahead of it while such other vehicle is braking. In this way, it is possible to check how well the test vehicle behaves in the autonomous or semiautonomous driving mode in this case.

The four criteria on the basis of which the exemplary predefined traffic situation is defined are not intended to be understood to be exclusive. For example, the criteria do not provide information regarding other vehicles which are in the test zone T, but not specifically addressed by criterion 1, criterion 2, and criterion 3. As a result, and due to the tolerances of the criteria, the random nature of randomized testing is preserved. For example, the four criteria do not indicate whether a further evasive maneuver in which the test vehicle E moves to a different lane is possible, or whether an additional vehicle traveling behind the test vehicle prohibits the braking maneuver by the test vehicle E.

If the situation check has detected a situation in which there are a certain number of vehicles in the right-hand lane, a particular vehicle can be selected that performs a change of lane with previously stipulated parameters. The change of lane can be varied in different runs of the simulation. This is depicted in FIG. 3, in which another vehicle, to the right and in front of the test vehicle E, provokes a critical situation by traveling into the middle lane a short distance in front of the test vehicle E. Here also, it is possible to check how well the test vehicle behaves in the autonomous or semiautonomous driving mode.

With reference to FIG. 4, according to a preferred exemplary embodiment of the invention, predefined traffic situations can be input on a screen using a GUI. FIG. 4, in particular, depicts the input of traffic situation entries which correspond to the example discussed hereinabove in connection with FIG. 2. The GUI is part of a piece of software for creating a simulation environment. According to the example of FIG. 4, maneuver definition corresponds to the test vehicle E, denoted by "Ego," and a plurality of "fellow" vehicles. The quantity of fellows is arbitrarily selectable by the user. For each fellow, a target specification in the form of absolute parameters (or parameters relative to the test vehicle) is storable via a text input field "requirements." For each fellow, there is also a second text input field. This second text input field is labeled "vehicle maneuver." The "vehicle maneuver" field for a given fellow can be used to define a maneuver that the fellow performs once all of the target specifications, set via the corresponding "requirements" text input field, have been met. A blank "vehicle maneuver" field means that the applicable fellow is not to perform any particular maneuver. According to the example of FIG. 4, the test vehicle is to travel at a speed of at least 40 km/h, and the first fellow is to be in the lane to the left of the test vehicle at a distance of no more than 10 m in front of or behind the test vehicle E.

LIST OF REFERENCE SIGNS

E Test vehicle
T Test zone

The invention claimed is:
1. A method for simulating different traffic situations for a test vehicle, comprising:
   simulated driving of the test vehicle through a simulated predetermined road network;
   simulated randomized driving of a plurality of other vehicles through the road network;
   capturing at least one driving parameter for the test vehicle;
   capturing at least one respective driving parameter for all other vehicles within a predetermined test zone around the test vehicle;
   determining, during the randomized driving of the other vehicles, whether the test vehicle and at least one other vehicle are in the test zone in a predefined traffic situation, wherein the predefined traffic situation is non-exclusively provided by at least one driving parameter of another vehicle within the test zone, or non-exclusively by at least one driving parameter of the test vehicle and at least one driving parameter of another vehicle within the test zone; and
   where the determination finds the test vehicle and at least one other vehicle to be in the test zone in the predefined traffic situation:
      terminating the randomized driving of at least one other vehicle in the predefined traffic situation;
      forcing a predetermined driving maneuver for the other vehicle which is no longer driving in randomized fashion, the predetermined driving maneuver being prescribed by the predefined traffic situation; and evaluating a response of the test vehicle to the driving maneuver in an autonomous or semiautonomous driving mode.

2. The method as claimed in claim 1, wherein the test vehicle has a sensor system, wherein the sensor system has at least one sensor for detecting objects within surroundings of the vehicle, and wherein the sensor system is controlled at least partially on a basis of signals captured by the sensor system.

3. The method as claimed in claim 2, wherein the test zone has dimensions around the test vehicle which are sufficiently large for a plurality of other vehicles to be able to drive in the test zone.

4. The method as claimed in claim 1, wherein the driving parameters comprise a position of the test vehicle or of another vehicle, a speed of the test vehicle or of another vehicle, a direction of the test vehicle or of another vehicle, and/or an acceleration of the test vehicle (E) or of another vehicle.

5. The method as claimed in claim 1, wherein the predefined traffic situation is provided by a respective range of values for a driving parameter taken into consideration.

6. The method as claimed in claim 1, wherein at least one driving parameter in a predefined traffic situation is prescribed as an absolute value or as a value relative to the test vehicle.

7. The method as claimed in claim 1, wherein the simulated randomized driving of the plurality of other vehicles through the road network is effected only within a predetermined distance from the test vehicle.

8. The method as claimed in claim 7, wherein the predetermined distance from the test vehicle corresponds to the test zone around the test vehicle.

9. The method as claimed in claim 1, wherein the predefined traffic situation prescribes performance of precisely one predetermined driving maneuver.

10. The method as claimed in claim 1, further comprising:

recording, from at least a time of determining that the test vehicle and at least one other vehicle are in the predefined traffic situation, driving parameters of the test vehicle and driving parameters of the other vehicles in the test zone.

11. A nonvolatile, computer-readable storage medium having commands stored thereon that, when executed on a processor, bring about a method as claimed in claim 1.

12. A computer system, configured for performing a method as claimed in claim 1.

\* \* \* \* \*